United States Patent
Lai et al.

(10) Patent No.: US 11,862,275 B2
(45) Date of Patent: Jan. 2, 2024

(54) SYSTEM AND METHOD FOR VERIFYING AND ANALYZING MEMORY FOR HIGH PERFORMANCE COMPUTING SYSTEMS

(71) Applicant: KINGTIGER TECHNOLOGY (CANADA) INC., Markham (CA)

(72) Inventors: Bosco Chun Sang Lai, Markham (CA); Sunny Lai-Ming Chang, Markham (CA); Lawrence Wai Cheung Ho, Mississauga (CA); Eric Sin Kwok Chiu, Mississauga (CA); Simon Shu Man Choi, Markham (CA); Arthur Yu Kuen Lam, Toronto (CA)

(73) Assignee: KINGTIGER TECHNOLOGY (CANADA) INC., Markham (CA)

( * ) Notice: Subject to any disclaimer, the term of this patent is extended or adjusted under 35 U.S.C. 154(b) by 163 days.

(21) Appl. No.: 17/436,002

(22) PCT Filed: Mar. 6, 2020

(86) PCT No.: PCT/CA2020/050310
§ 371 (c)(1),
(2) Date: Sep. 2, 2021

(87) PCT Pub. No.: WO2020/176999
PCT Pub. Date: Sep. 10, 2020

(65) Prior Publication Data
US 2022/0148673 A1    May 12, 2022

Related U.S. Application Data

(60) Provisional application No. 62/814,341, filed on Mar. 6, 2019.

(51) Int. Cl.
*G11C 29/44* (2006.01)
*G11C 29/46* (2006.01)
(Continued)

(52) U.S. Cl.
CPC .......... *G11C 29/4401* (2013.01); *G11C 29/46* (2013.01); *G11C 29/56004* (2013.01);
(Continued)

(58) Field of Classification Search
None
See application file for complete search history.

(56) References Cited

U.S. PATENT DOCUMENTS 9,117,552 B2    8/2015    Lai et al.
2014/0260333 A1*  9/2014    Lopez ............... G01R 31/2874
                                                                62/126

FOREIGN PATENT DOCUMENTS

CN      108709654 A  * 10/2018    ............... G01K 7/02
WO      2019018929 A1    1/2019

OTHER PUBLICATIONS

Bianca Schroeder, Eduardo Pinheiro and Wolf-Dietrich Weber "DRAM Errors in the Wild: A Large-Scale Field Study" SIGMETRICS/Performance'09, Jun. 15-19, 2009, Seattle, WA, USA. Copyright 2009 (available ACM 978-1-60558-511-6/09/06 at http://www.cs.utoronto.ca/~bianca/papers/sigmetrics09.pdf).

* cited by examiner

*Primary Examiner* — April Y Blair
*Assistant Examiner* — Matthew W Wahlin
(74) *Attorney, Agent, or Firm* — BERESKIN & PARR LLP/S.E.N.C.R.L. s.r.l; Tonino Rosario Orsi

(57) ABSTRACT

Systems and methods are provided for testing a Device Under Test (DUT) in its working environment. A control computer is coupled to an air compressor and generates a temperature control signal that is provided to the air compressor to generate an amount of hot air or cold air to set the temperature of the DUT's working environment to a desired test temperature. The control computer also generates at least one test signal that is sent to a hardware test element for (Continued)

testing at least one memory component of the DUT at the desired test temperature and obtaining test results. The control computer analyzes the test results to determine a parameter adjustment for the at least one memory element so that it operates in a stable manner at the test temperature.

20 Claims, 9 Drawing Sheets

(51) Int. Cl.
*G11C 29/56* (2006.01)
*G11C 29/04* (2006.01)

(52) U.S. Cl.
CPC ................ *G11C 2029/0409* (2013.01); *G11C 2029/5602* (2013.01)

SYSTEM AND METHOD FOR VERIFYING AND ANALYZING MEMORY FOR HIGH PERFORMANCE COMPUTING SYSTEMS

CROSS-REFERENCE TO RELATED APPLICATION

This application is a 35 USC § 371 national stage entry of International Patent Application No. PCT/CA2020/050310, filed Mar. 6, 2020, which claims the benefit of U.S. Provisional Patent Application No. 62/814,341, filed Mar. 6, 2019, and entitled "SYSTEM AND METHOD FOR VERIFYING AND ANALYZING MEMORY FOR HIGH PERFORMANCE COMPUTING SYSTEMS"; the entire contents of each of which are hereby incorporated by reference.

FIELD

Various embodiments are described herein that generally relate to systems and method for testing memory performance under different operating conditions.

BACKGROUND

In computer testing, a burn-in test is a type of test that is run for an extended length of time on a Device Under Test (DUT) in order to identify any potential problems that the DUT may have before the DUT is deployed for use in a particular industry or in the open market. In particular, the burn-in test aims to reveal any problems or defects within the DUT by operating the DUT in the different working conditions, such as high temperatures. The DUT may be a computer, a hardware device, a memory module, another electronic component or another electronic system. The burn-in tests are typically performed in a manufacturing facility and the test results typically comprise only a pass or fail result.

The burn-in test can be performed at a system level of the DUT or it can be performed at a modular level of the DUT, individually on each electronic component of the DUT, for example. If any component is defective, it is most likely to be detected during the burn-in test. In electronic devices, a burn-in test usually determines the maximum temperature it can sustain. The DUTs that pass the burn-in testing are then deployed for use in the field whereas the DUTs that fail can be discarded.

Computer memory is one of the main causes of system failure in a computer during use in the field. A large-scale research study of memory failures found the following:
- memory failure rates are much higher than previously reported, i.e. on the order of hundreds to thousands of times higher than initially thought;
- ⅓ of computers, and over 8% of Dual Inline Memory Modules (DIMMs), experience at least one error per year;
- a registered DIMM (RDIMM), on average, may experience an error 10 times per day;
- new generation DIMMs don't have higher error rates despite concerns that advancing densities in Dynamic Random Access Memories (DRAMs) may lead to the higher rates of errors;
- error rates are strongly correlated with memory utilization; and
- error rates are not dominated by soft errors.

This study was published as "DRAM Errors in the Wild: A Large-Scale Field Study" by Bianca Schroeder, Eduardo Pinheiro and Wolf-Dietrich Weber in SIGMETRICS/Performance'09, Jun. 15-19, 2009, Seattle, Wash., USA. Copyright 2009 ACM 978-1-60558-511-6/09/06 (available at http://www.cs.utoronto.ca/~bianca/papers/sigmetrics09.pdf).

However, as described above, conventional burn-in testing of memory devices and other DUTs is typically done only to determine a pass or fail result. While DUTs that pass the burn-in testing are deployed for use in the field, the burn-in test results are not used after deployment.

SUMMARY OF VARIOUS EMBODIMENTS

In a broad aspect, at least one embodiment is provided in accordance with the teachings herein for a system for performing memory testing on a Device Under Test (DUT) in a working environment in which it will operate when deployed, wherein the system comprises: an air compressor that is adapted to generate hot or cold air; a first conduit that is coupled between the air compressor and an air conduit associated with the DUT to provide the generated hot or cold air to the air conduit to adjust an internal temperature the working environment of the DUT to a desired test temperature; and a control computer that is coupled to the air compressor and the DUT, the control computer comprising a control processing unit having hardware that is configured to: generate a temperature control signal that is provided to the air compressor to generate an amount of the hot air or cold air to set the internal temperature of the DUT to the desired test temperature; generate at least one test signal to test that is used for testing at least one memory component of the DUT; send the at least one test signal to a test hardware element that is configured for performing testing on the at least one memory component of the DUT at the desired test temperature; obtain test results for testing the at least one memory component of the DUT at the desired test temperature; determine a parameter adjustment of the at least one memory element based on the test results so that the at least one memory element operates in a stable manner at the desired test temperature; and store the parameter adjustment along with the desired test.

In at least one embodiment, the test hardware element comprises a server.

In at least one embodiment, the server comprises a test control module that is configured to receive the at least one test signal from the test control module, perform the testing on the DUT, record test results and send the test results to the test control module.

In at least one embodiment, the server comprises a BIOS program and the control computer is configured to update to the BIOS program to perform the memory testing.

In at least one embodiment, the control computer is configured to determine given memory components that fail the memory tests and send a command to the server to repair the given memory components.

In at least one embodiment, the control computer is configured to determine given memory components that fail the memory tests and when the given memory components cannot be repaired the control computer is configured to send a command to the server to isolate the given memory components.

In at least one embodiment, the control computer is configured to categorize the DUT based on performance of the memory testing of the DUT.

In at least one embodiment, the parameter adjustment comprises determining margins for a timing window for reading and/or writing to memory of the DUT in a stable manner and the desired test temperature.

In at least one embodiment, the control computer is further configured to generate the temperature control signal, generate the at least one test signal, determine the parameter adjustment and store the parameter adjustment for a plurality of test temperatures for testing the at least one memory component of the DUT from a lowest temperature to a highest temperature.

In at least one embodiment, the air compressor and the control computer are located in a test unit housing that is physically separate from the DUT.

In at least one embodiment, the first conduit is coupled to at least one branch point to connect the physical test unit with air conduits associated with at least two DUTs for testing the at least two DUTs in parallel at the desired test temperature.

In at least one embodiment, the DUT is a memory module of a server.

In at least one embodiment, there are multiple DUTs in a rack mounted server with a plurality of servers components each having an associated DUT mounted on separate racks within the rack mounted server and the air conduit has a plurality of outputs for providing the generated air to the DUTs of each of the servers.

In at least one embodiment, the air conduit associated with the DUT is an internal air conduit that is located within a housing that includes the DUT or the air conduit associated with the DUT is an external air conduit that is mounted to an external surface of the housing that includes the DUT with outlets adjacent to air vents of the DUT to provide the generated air into the DUT.

In at least one embodiment, the DUT comprises a DUT housing and the air compressor and the control computer are located in a housing that includes the DUT and the air conduit associated with the DUT is an internal air conduit that is located within the housing that includes the DUT.

In another broad aspect, at least one embodiment is provided in accordance with the teachings herein of a method for performing memory testing on a Device Under Test (DUT) in its working environment in which it will operate when deployed, wherein the method comprises: coupling an air compressor to an internal space with a housing of the DUT; generating a temperature control signal that is provided to the air compressor to generate an amount of hot air or cold air to set an internal temperature of the working environment of the DUT to a desired test temperature; generating, using a control computer, at least one test signal to test at least one memory component of the DUT at the desired test temperature; sending the at least one test signal to a test hardware element that is configured for performing testing on the at least one memory component of the DUT at the desired test temperature; performing, using the test hardware element, testing on the at least one memory component of the DUT at the desired test temperature using the at least one test signal; obtaining, at the control computer, test results for testing the at least one memory component of the DUT at the desired test temperature; determining, at the control computer, a parameter adjustment of the at least one memory element based on the test results so that the at least one memory element operates in a stable manner at the desired test temperature; and storing the parameter adjustment along with the desired test temperature.

In at least one embodiment, the test hardware element comprises a test control module the method comprises receiving the at least one test signal at the test control module, performing the testing on the DUT using the test control module, record test results using the test control module and sending the test results to the control computer.

In at least one embodiment, the test hardware element is a server that comprises a BIOS program and the method comprises sending data from the control computer to the server to update the BIOS program to perform the memory testing.

In at least one embodiment, the method comprises determining, using the control computer, given memory components that fail the memory tests and sending a command to the server to repair the given memory components.

In at least one embodiment, the method comprises determining, using the control computer, given memory components that fail the memory tests and when the given memory components cannot be repaired a command is sent from the control computer to the server to isolate the given memory components.

In at least one embodiment, the method comprises categorizing the DUT, using the control computer, based on performance of the memory testing of the DUT.

In at least one embodiment, the parameter adjustment comprises determining margins for a timing window for reading and/or writing to memory of the DUT in a stable manner and the desired test temperature.

In at least one embodiment, the method comprises, using the control computer, generating the temperature control signal, generating the at least one test signal, determining the parameter adjustment and storing the parameter adjustment for a plurality of test temperatures for testing the DUT from a lowest temperature to a highest temperature.

Other features and advantages of the present application will become apparent from the following detailed description taken together with the accompanying drawings. It should be understood, however, that the detailed description and the specific examples, while indicating one or more embodiments of the application, are given by way of illustration only, since various changes and modifications within the spirit and scope of the application will become apparent to those skilled in the art from this detailed description.

BRIEF DESCRIPTION OF THE DRAWINGS

For a better understanding of the various embodiments described herein, and to show more clearly how these various embodiments may be carried into effect, reference will be made, by way of example, to the accompanying drawings which show at least one example embodiment, and which are now described. The drawings are not intended to limit the scope of the teachings described herein.

Figure 1A:
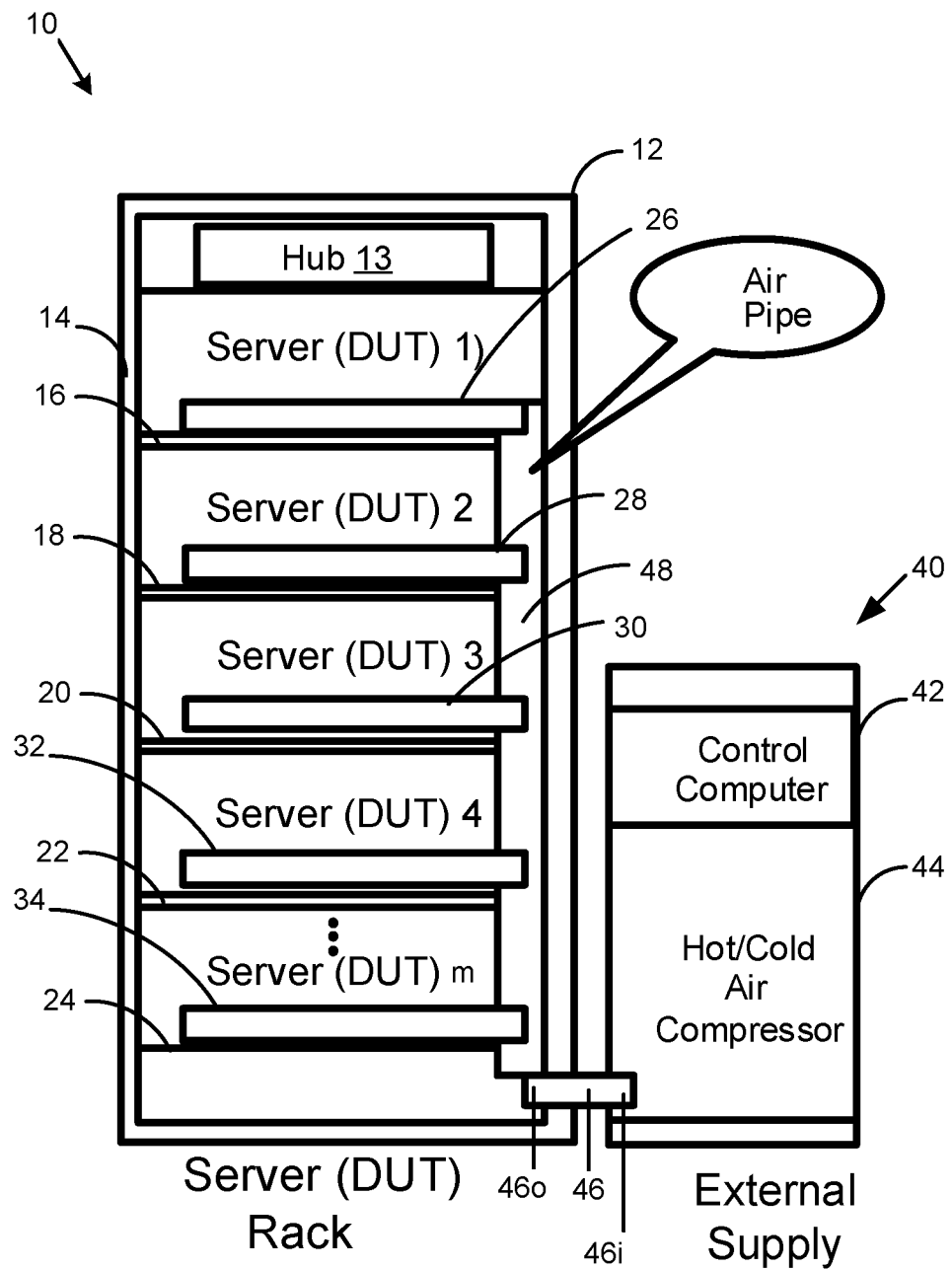
FIG. 1A is a schematic of an example embodiment of a test setup that may be used to test multiple DUTs to verify and analyze memory performance at different operating temperatures and to optionally perform repairs and categorize the DUTs in accordance with the teachings herein.

Further aspects and features of the example embodiments described herein will appear from the following description taken together with the accompanying drawings.

DETAILED DESCRIPTION OF THE EMBODIMENTS

Various systems, devices or methods will be described below to provide an example of at least one embodiment of the claimed subject matter. No embodiment described herein limits any claimed subject matter and any claimed subject matter may cover systems, devices or methods that differ from those described herein. The claimed subject matter is not limited to systems, devices or methods having all of the features of any one process or device described below or to features common to multiple or all of the systems, devices or methods described herein. It is possible that a system, device or method described herein is not an embodiment of any claimed subject matter. Any subject matter that is disclosed in a system, device or method described herein that is not claimed in this document may be the subject matter of another protective instrument, for example, a continuing patent application, and the applicants, inventors or owners do not intend to abandon, disclaim or dedicate to the public any such subject matter by its disclosure in this document.

Furthermore, it will be appreciated that for simplicity and clarity of illustration, where considered appropriate, reference numerals may be repeated among the figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. Also, the description is not to be considered as limiting the scope of the embodiments described herein.

It should also be noted that the terms "coupled" or "coupling" as used herein can have several different meanings depending in the context in which these terms are used. For example, the terms coupled or coupling can have a mechanical, electrical or communicative connotation. For example, as used herein, the terms coupled or coupling can indicate that two or more elements or devices can be directly connected to one another or connected to one another through one or more intermediate elements or devices via an electrical element, electrical signal or a mechanical element depending on the particular context. Furthermore, the term "communicative coupling" indicates that an element or device can electrically, or wirelessly send data to or receive data from another element or device depending on the particular embodiment. Alternatively, the term coupling may indicate that there is a fluid flow, such as gas or liquid, which flow between two or more elements.

It should also be noted that, as used herein, the wording "and/or" is intended to represent an inclusive-or. That is, "X and/or Y" is intended to mean X or Y or both, for example. As a further example, "X, Y, and/or Z" is intended to mean X or Y or Z or any combination thereof.

It should also be noted that terms of degree such as "substantially", "about" and "approximately" as used herein mean a reasonable amount of deviation of the modified term such that the end result is not significantly changed. These terms of degree may also be construed as including a deviation of the modified term if this deviation would not negate the meaning of the term it modifies.

Furthermore, the recitation of numerical ranges by endpoints herein includes all numbers and fractions subsumed within that range (e.g., 1 to 5 includes 1, 1.5, 2, 2.75, 3, 3.90, 4, and 5). It is also to be understood that all numbers and fractions thereof are presumed to be modified by the term "about", which means a variation of up to a certain amount of the number to which reference is being made if the end result is not significantly changed, such as 10%, for example.

The example embodiments of the systems, devices or methods described in accordance with the teachings herein may be implemented as a combination of hardware and software. For example, the embodiments described herein may be implemented, at least in part, by using one or more computer programs, executing on one or more programmable devices comprising at least one processing element, and at least one data storage element (including volatile and non-volatile memory). It should also be noted that there may be some elements that are used to implement at least part of the embodiments described herein that may be implemented via software that is written in a high-level procedural language such as object oriented programming. The program code may be written in C, C++ or any other suitable programming language and may comprise modules or classes, as is known to those skilled in object oriented programming. Alternatively, or in addition thereto, some of these elements implemented via software may be written in assembly language, machine language or firmware as needed.

At least some of these software programs may be stored on a storage media (e.g., a computer readable medium such as, but not limited to, ROM, magnetic disk, optical disc) or a device that is readable by a general or special purpose programmable device. The software program code, when read by the programmable device, configures the programmable device to operate in a new, specific and predefined manner in order to perform at least one of the methods described herein.

Furthermore, at least some of the programs associated with the systems and methods of the embodiments described herein may be capable of being distributed in a computer program product comprising a computer readable medium that bears computer usable instructions, such as program code, for one or more processors. The program code may be preinstalled and embedded during manufacture and/or may be later installed as an update for an already deployed computing system. The medium may be provided in various forms, including non-transitory forms such as, but not limited to, one or more diskettes, compact disks, tapes, chips, and magnetic and electronic storage. In alternative embodiments, the medium may be transitory in nature such as, but not limited to, wire-line transmissions, satellite transmissions, internet transmissions (e.g. downloads), media, digital and analog signals, and the like. The computer useable instructions may also be in various formats, including compiled and non-compiled code.

In accordance with the teachings herein, there is provided a testing system that can be used to test one or more DUTs in a state in which they are normally used by connecting the one or more DUTs to the testing system. The testing system is then used to alter the operating temperature of the one or more DUTs and perform memory testing to determine memory performance at various operating temperatures. The memory performance at a given operating temperature may then be used to identify and improve the performance of the memory component of a given DUT such as by, for example, noting certain memory parameters such as the margin for the timing window which can be set differently for the different operating temperatures so that the memory operation is more stable at the different operating temperatures.

Referring now to FIG. 1A, shown therein is a schematic of an example embodiment of a test setup 10 including a testing system 40 that may be used to test an DUT assembly 12 having several DUTs, such as in a sever rack housing with several servers each having a DUT, for example, to verify and analyze memory performance of the DUTs at different operating temperatures as well as optionally repair and categorize the DUTs in accordance with the teachings herein. The testing system 40 generally includes a control computer 42 and an air compressor 44 (or an air generator) for generating hot or cold air.

The testing system 40 can be used with different types of DUTs for testing the DUTs in its natural working environment (i.e. its environment (e.g. physical housing) in which it will operate when deployed) by altering an internal temperature within a frame or housing of the DUT assembly 12. Accordingly, the testing system 40 will provide more accurate performance test results in comparison with conventional techniques where individual memory components of the DUT assembly 12 are loaded into a hot or cold chamber and tested individually and the memory components that pass the tests are then assembled into the DUT assembly 12 and deployed for use in the field. It should be noted that while the testing is generally described herein with respect to the DUT assembly 12, which has a plurality of DUTs, in other embodiments, the testing may be performed on an assembly or device having only one DUT.

Accordingly, for the testing performed in accordance with the teachings discussed herein, the DUT assembly 12 is modified to include an internal conduit 48, also known as an air pipe, for receiving the air generated by the air compressor 44 so that the internal temperature of the DUT assembly 12 can be set to a desired test temperature before the memory testing is performed.

For illustrative purposes, in the example embodiments discussed herein the DUT assembly 12 is a rack mounted server or a tower server. However, the DUT assembly 12 can be a variety of different types of electronic devices or systems. As a rack mounted server, the DUT assembly 12 has a communication hub 13, such as a router or a multiplexer, for example, and a frame or housing 14 to which a plurality of shelves or racks 16, 18, 20, 22 and 24 are mounted thereby forming bays. The DUT assembly 12 also has a plurality of servers with one or more DUTs that are to be tested, referred to as server (DUT) or just a server DUT 26, 28, 30, 32, 34, or other hardware devices, which are mounted on the associated racks 16, 18, 20, 22 and 24 using fasteners such as screws for example. Each of the server DUTs 26 to 34 may be considered to be servers that each have a separate DUT that are to be tested. There may be up to m server DUTs where m is an integer. While there are m racks and m server DUTs in this example embodiment, there can be a different number of racks and a different number of server DUTs or other types of DUTs in other embodiments. There is also generally a cooling system that is included with the rack mounted server to remove any excessive heat buildup but this cooling system is not shown in FIG. 1A.

The internal conduit 48 is mounted to the housing 14 such that the internal conduit 48 can provide air that is generated by the air compressor 44 to the various internal hardware components of the DUT assembly 12 that have memory components that will be tested in accordance with the teachings herein. Accordingly, the internal conduit 48 may include vents that are adjacent to each hardware component (e.g. server DUTs 1 to m) that will undergo memory performance testing at various temperatures.

In an alternative embodiment, rather than including the internal conduit 48, a similar external conduit may be provided which mounts to the outside of the frame 14 of the DUT assembly 12 and has outlets that are located at similar locations as the air vents for each of the sever DUTs that are to be tested. In this case, the external conduit pumps the generated air into the enclosure of the DUT assembly 12 through the vents (not shown) in the frame 14 of the DUT assembly 12.

As mentioned the testing system 40 is used to perform memory testing on various DUTs, e.g. memory modules, of the DUT assembly 12 in its working environment. In this example embodiment, the air compressor 44 and the control computer 42 are located in a test unit housing that is physically separate from the housing 14 of the DUT assembly 12. However, there may be alternative physical setups as shown in the example embodiments of FIGS. 2 and 3.

The air compressor 44 of the testing system 40 is adapted to generate hot air or cold air. The testing system also includes a first conduit 46 that is coupled between the air compressor 44 and the air conduit 48 associated with the DUT assembly 12 to provide the generated hot air or cold air to the air conduit 48 to adjust an internal temperature of the DUT assembly 12. Accordingly, the first conduit 46 has an inlet 46i for receiving the air from the air compressor 44 and an outlet 46o for providing the generated air to the air conduit 48.

The control computer 42 of the testing system is coupled to the air compressor 44 and the DUT 12. The control computer 42 generally comprises a processing unit having hardware that is configured to generate a temperature control signal that is provided to the air compressor 44 to generate the amount of hot air or cold air that is needed to set the internal temperature of the DUT assembly 12 to a desired test temperature. In at least one embodiment, the processing unit of the control computer 42 is further configured to:

generate at least one test signal having test sequences for performing certain tests on at least one memory component for one or more DUTs;

send the at least one test signal to the server DUTs (or other test hardware element of the DUT assembly 12), via the communication hub 13 in the example embodiment of FIG. 1A, so that at least one memory component of one or more of the DUTs are tested at the desired test temperature using the at least one test signal;

obtain test results from the testing of the at least one memory component of the DUTs that was performed at the test desired temperature;

determine a parameter adjustment of the at least one memory component based on the test results so that the at least one memory component operates in a stable manner at the desired test temperature;

store the parameter adjustment along with the desired test temperature in a database; and repeat the testing for other test temperatures.

The processing unit may comprise one or more processors, for example.

The control computer 42 is generally further configured to generate the temperature control signal, generate the at least one test signal, control the various servers (i.e. test hardware elements) in the DUT assembly 12 to perform the testing on one or more of the corresponding DUTs using the at least one test signal; obtain the test results, determine the parameter adjustment and store the parameter adjustment for a plurality of test temperatures for testing one or more of the DUTs from a lowest temperature to a highest temperature.

In at least one embodiment, the control computer 42 can analyze the test results to determine if any given memory components of the DUTs that were tested operate in error, calculate the addresses of the memory components (i.e. the physical locations of the memory cells and/or memory blocks) that operate in error, determine if one or more of the given memory components can be repaired and if so send commands to the server that corresponds to the DUT having the defective memory components for repairing the one or more of the given memory components or if one or more of the given memory components cannot be repaired then send commands to the server that corresponds to the DUT having those defective memory components to not use (e.g. isolate) those one or more given memory components. In at least one embodiment, when repairs are made, the control computer 42 may send out further test sequences to perform further testing on the one or more given memory components that were repaired to ensure that they are now operating properly. If not, then further parameter adjustments and testing may be done.

In at least one embodiment, the control computer 42 can analyze the test results to categorize the performance of the memory components of the tested DUTs to indicate a level of quality for the tested DUTs. For example, if a first DUT has memory components that operate correctly over a wider temperature range compared to a second DUT, then the first DUT can be categorized as having a higher quality or higher performance than the second DUT. As another example, if a third DUT has memory components with wider margins for the timing window compared to a fourth DUT, then the third DUT can be categorized as having a higher quality or higher performance than the fourth DUT. Other methods for categorization of quality and/or performance of the memory components can be used.

In at least one embodiment, the control computer 42 can: (a) analyze the test results of the tested DUTs to determine if any given memory components of the DUTs that were tested operate in error, locate the physical addresses of these memory components and attempt to repair or isolate these memory components; and also (b) categorize the performance of the memory components of the DUTs as explained previously.

The range of temperature testing can vary depending on the intended use of the DUT. For example, for military applications there can be a wide range of test temperatures ranging from a very cold temperature such as absolute zero temperature (i.e. −273.15 degrees Celsius), for example, to a high temperature of about 125 degrees Celsius or more. Other minimum and maximum values can be set for the test temperatures as desired. During testing, the test temperatures can range uniformly from the lowest test temperature to the highest test temperature or another spacing may be used when increasing or decreasing the test temperatures.

There may be various changes in temperatures during testing. For example, the test temperatures may be increased from the lowest temperature to the highest temperature during testing. Alternatively, the test temperatures may decreased from the highest temperature to the lowest temperature during testing. In another alternative, the test temperatures may be increased and then decreased and then increased again using the same or different temperature increments within a first temperature sub-range of the temperature test range. As another alternative, the test temperatures may be decreased and then increased and then decreased again using the same or different temperature increments within a second temperature sub-range of the temperature test range. The first and second temperature sub-ranges may be the same or different.

In at least one embodiment, the parameter adjustment may comprise determining margins (e.g. start and stop times) for the timing window used to read and write to the tested memory components. For example, these margins may include margins for various different types of memory such as, but not limited to margins for DRAM, so that the tested memory components of the DUT operates in a stable manner at the tested temperature.

In at least one embodiment, the determined margins at each test temperature can be stored along with the test temperatures into a memory of a test hardware element, such as a Non-Volatile RAM (NVRAM) of the server that uses the tested DUT, for example, as worst cases parameters to be used when the tested DUT is operating at an internal temperature that is closest to one of the stored test temperatures. This recorded test data can be stored as a look-up table in some embodiments. In cases where the internal temperature is between the two stored test temperatures of the recorded test data, linear interpolation of the parameter adjustment values for the two stored temperatures may be used to determine a value for the parameter adjustment.

In some embodiments, the recorded test data can be used in further analysis such as in part of big data analysis to improve the quality and future development of the memory components of the DUTs.

Figure 1B:
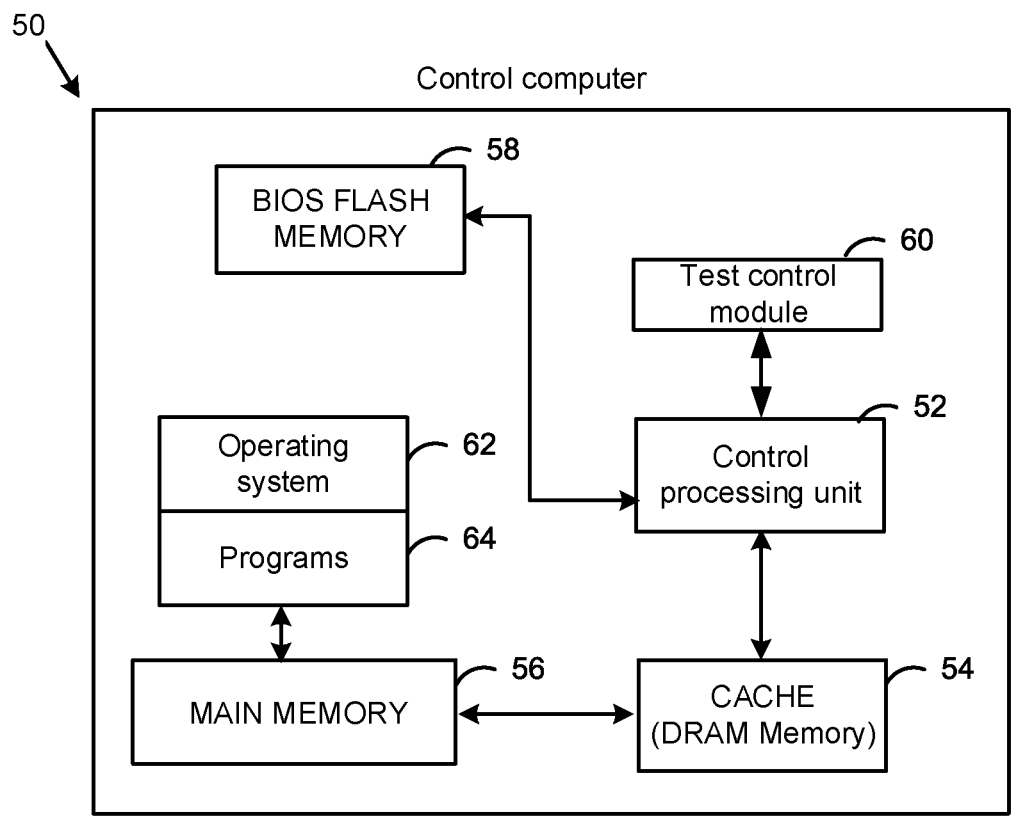
FIG. 1B is a block diagram of an example embodiment of a control computer that can be used to control testing of DUTs in accordance with the teachings herein.

Referring now to FIG. 1B, shown therein is a block diagram of an example embodiment of a control computer 50 that can be used to control testing of DUTs in accordance with the teachings herein. The control computer 50 is one example implementation of the control computer 42 and there may be other ways of implementing the control computer 42 as long as the functionality described herein is provided. The control computer 50 generally includes a control processing unit 52, a cache (DRAM) memory device 54, a main memory 56, a BIOS flash memory 58, and a test control module 60. It should be noted that in different embodiments, there may be different elements than what is shown in FIG. 1B.

The control processing unit 52 controls the operation of the control computer 50 and can be any suitable processor, controller or digital signal processor that can provide sufficient processing power depending on the configuration and operational requirements of the control computer 50. For example, the control processing unit 52 may be a high performance general processor. In alternative embodiments, the control processing unit 52 may include more than one processor with each processor being configured to perform different dedicated tasks. In alternative embodiments, specialized hardware, such as an Application Specific Integrated Circuit (ASIC) or a Field Programmable Gate Array (FPGA), for example, may be used to provide some or all of the functions provided by the control processing unit 52.

The cache memory 54 may be implemented using DRAM technology. The cache memory 54 performs the work of an intermediary between the main memory 56 and the control processing unit 52. The cache memory 54 can be used to store program instructions and data physically closer to the control processing unit 52 which significantly decreases the wait time when the control processing unit 52 stays idle in anticipation of receiving required instructions and data. The cache memory 54 can also include data and/or program instructions that are frequently used so that they can be accessed more quickly by the processing unit 12. For example, during normal operation, the same data may be read from the cache memory 54 several times or there may be a high likelihood that multiple READ and WRITE operations may be combined in a single memory block (i.e., the cache memory 54).

The main memory 56 is non-volatile memory that stores data that is used by the control processing unit 52 during the operation of the control computer 50. For example, the main memory 56 may include the program instructions and data for the Operating System (OS) 60 and other programs 62 that operate on the control computer 50. The main memory 56 may be FLASH memory, for example. The cache memory 54 is connected to the main memory 56 to obtain data and/or program instructions from the main memory 56 and store the data and/or program instructions.

The BIOS FLASH memory 58 is a memory device that is used to store BIOS settings. The BIOS FLASH memory 58 is located on a circuit board (e.g. the motherboard) that is part of the control computer 50. The BIOS settings may be used to load the OS for the control computer 50. The BIOS settings may also be used to perform tests such as various power-on tests, perform activation of other BIOS chips for other hardware used by the control computer 50, initialize various registers, and provide an interface for the control computer 50 with other hardware used by the control computer 50, among other things.

The control processing unit 52 may have a controller that controls the operation of the main memory 16 and the cache memory 54 including data transfer between these elements. The implementation of the controller depends on the type of memory used for the main memory 56. For example, when the main memory 56 comprises flash memory, a solid state drive or a hard disk, then the controller may be a flash controller, an SSD controller or a disk controller, respectively. The controller may also perform various functions such as, but not limited to, Error Correcting Coding (ECC) and wear leveling, for example, in some embodiments.

When the control processing unit 52 is finished performing a particular task, such as controlling the memory testing of one or more DUTs at a desired test temperature in accordance with the teachings herein, it can analyze the results and output the results via an output (not shown), which may be a display or an output port for connection to another computing device or a peripheral device. Alternatively, or in addition thereto, when the control processing unit 52 is finished performing a particular task, such as controlling memory testing at a desired test temperature in accordance with the teachings herein, it can save the test results to the main memory 56 or to the memory of the DUT 12. Accordingly, the output may be, but is not limited to, a serial port, a parallel port, and a USB port, for example, depending on the particular implementation of the DUT assembly 12, in order to send the test results to the memory of the server 70 of the DUT assembly 12.

The test control module 60 can be implemented using at least one of software and hardware and is used to control the operation of the memory testing that is performed on one of more DUTs of the DUT assembly 12. In some embodiments, the test control module 60 may be implemented using program code. Alternatively, in some embodiments, the test control module 60 may be implemented using hardware such as an ASIC. The test control module 60 may be used to modify the operation of the BIOS of a test hardware element of the DUT assembly 12, such as particular server from the group of servers, in order to perform the memory testing on a DUT that corresponds to the particular server. Certain aspects of the operation of the test control module 64 is described in more detail with respect to at least one example embodiment shown in FIGS. 4, 5A and 5B.

For example, in at least one embodiment, in addition to controlling the memory testing, the test control module 60 can obtain the test results, analyze the test results to determine if there are memory components of a given tested DUT that perform with an error, and calculate the addresses of these memory components that perform erroneously. In at least one embodiment, the test control module 60 may further include program instructions for sending commands to the given tested DUT to repair the memory components that operate erroneously when they can be repaired or to isolate the memory components when they cannot be repaired. Alternatively, in at least one embodiment, the test control module 60 may contain program instructions for categorizing the memory components of the given tested DUT based on quality and/or performance as described previously. Alternatively, in at least one embodiment, the test control module 60 can include program instructions for performing all of the actions described in this paragraph.

Figure 1C:
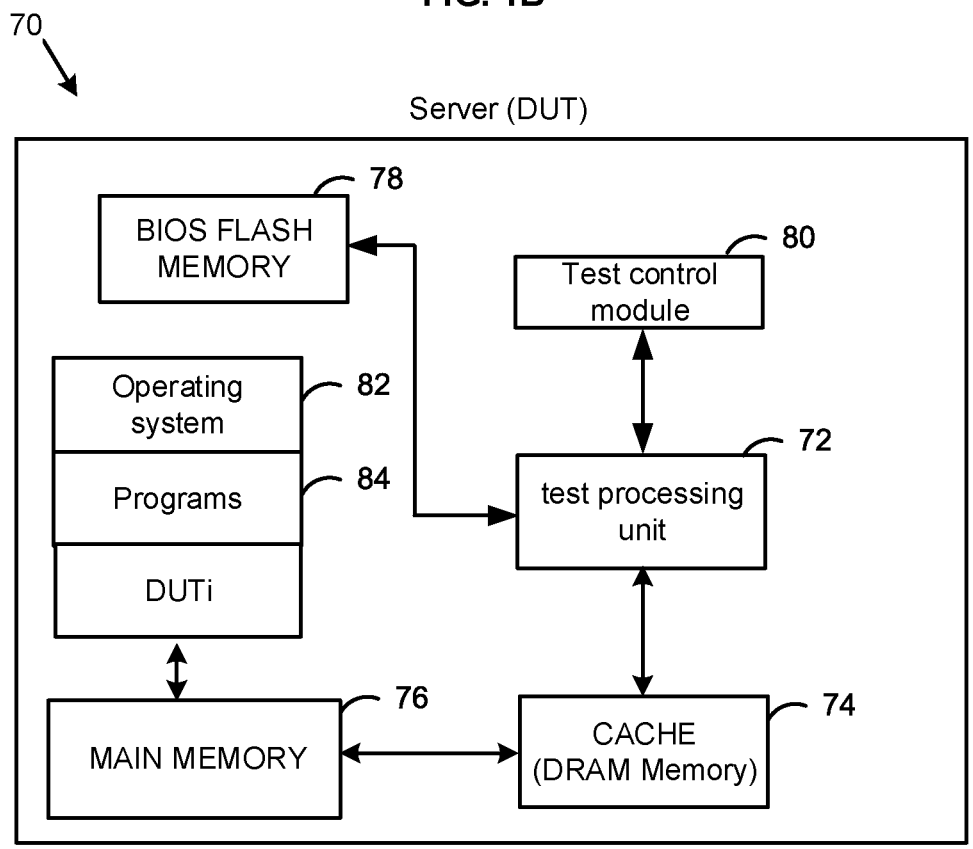
FIG. 1C is a block diagram of an example embodiment of a server that can be controlled by the control computer to perform testing of a DUT in accordance with the teachings herein.

Referring now to FIG. 1C, shown therein is a block diagram of an example embodiment of a server 70 (e.g. test hardware element) having a DUTi where operation of the server 70 can be controlled by the control computer 50 to perform testing of the DUTi in accordance with the teachings herein. Since the server 70 may have multiple memory slots, it is possible for several DUTs (e.g. several physically separate memory modules) to be connected to the server and for memory testing to be performed on any one of the DUTs represented by DUTi. In some cases though DUTi may just represent one DUT. The server 70 generally includes similar components as the control computer 50. For example, the server 70 includes a test processing unit 72, cache memory 74, main memory 76 having an operating system 82 and programs 84, a BIOS flash memory 78 and a test control module 80. The implementation of the components 72, 74, 76, 78, 82 and 84 may be similar to the corresponding components 52, 54, 56, 58, 62 and 64 and therefore will not be further discussed. However, certain components will function differently in at least one aspect such as the BIOS flash memory 78. The server 70 is one example implementation of the server (DUT)s and in other embodiments other server implementations or other test hardware implementations may be used as long as the functions described herein are provided by these implementations.

The test control module 80 can be similarly implemented using software, hardware or a combination of software and hardware as described for the test control module 60. However, the functionality of the test control module 80 is different than that of the test control module 60. The test control module 80 is used to send the test sequences to a particular DUTi, that is being tested and obtain test results. For example, the test control module 80 may write data to a given section of the DUTi according to a test sequence and then read data from the given section of the DUTi and obtain test results based on determining if the read data is the same as the data which was previously written to the give section of the DUTi. In at least one embodiment, the DUTi is the main memory 76. However, as a server board has many different slots to receive memory components, the DUTi may be another memory component that is different from the main memory 76 or the main memory 76 may be made from several different memory boards and one of those is tested and represented by DUTi. Once the test control module 80 obtains the test results, the test control module 80 sends the test results to the test control module 60 of the control computer 50 so that the test control module 60 can perform analysis and in some cases calculate locations of memory components that are operating erroneously, perform repair and/or isolation and optionally categorize the performance or quality of the memory components of the tested DUTs. For example, the test control module 80 is communicatively coupled to the test control module 60 via the communication hub 13. The communication hub 13 has an appropriate connection with the control computer such as a USB connection or some other high speed communication channel for handling the amount of data that is communicated between the control computer 50 and the communication hub 13.

In at least one embodiment, to initiate and control the testing, the test control module 60 can generate at least one control signal that is sent to the air compressor for generating hot air or cold air to achieve a desired test temperature within the DUT assembly. The test control module 60 also generates and sends data to the server 70 to reflash the BIOS of the server 70 so that the testing can be performed as part of the operation of the server 70 at certain times such as, for example, during startup. The test control module 60 also generates test sequences that can be used for testing the memory components of at least one of the DUTs 28 to 34 of the DUT assembly 12. The test sequences are then used by the test control module 80 for performing testing of the memory components of at least one of the DUTs 28 to 34 of the DUT assembly 12.

For example, in at least one embodiment, an iMS (intelligent Memory Surveillance) of a hardware element at the DUT assembly 12, such as the server 70, may be modified to implement the memory testing. The iMS is diagnostic tool that can be run in the early Driver eXecution Environment (DXE) phase of the BIOS, which is entered by boot-up control flags when a computer boots up. For example, a "Test Pattern Control Sequencer" can be initialized by the iMS and used in performing a memory diagnostic. A version of the iMS that can be modified to perform the testing in accordance with the teachings herein is described in U.S. Pat. No. 9,117,552 titled "Systems and methods for testing memory" which was granted on Aug. 25, 2015 and is hereby incorporated by reference in its entirety. The iMS tool can be used to protect a computing system from harmful consequences arising from a memory failure, such as a computer crash. Some previous methods for testing memory, such as DRAM, that are implemented by the iMS diagnostic tool are described in U.S. Pat. No. 9,117,552.

The iMS diagnostic tool can also interact with the MRC (Memory Reference Code) for memory re-configurations, the CPGC (Converged-Pattern-Generator-Checker) to perform certain memory tests and the RMT (Rank Margining Tool) to provide memory margin testing (i.e. for margining of Vref and Timing parameters for the CPU and DIMMs with certain test patterns). The interaction of the iMS diagnostic tool with the MRC, the CPGC and the RMT forms a highly integrated ATE/Application Hybrid Burn-in Testing System.

The iMS diagnostic tool for the server 70 can be used during boot-up to start running a memory test according to a test plan. In this case, the memory test is not run until the internal temperature near a hardware component of one or more of the DUTs that are being tested is at one of the desired test temperatures in the test temperature range. This test temperature may be monitored by the control computer 50 via the test control module 80 using temperature data received from one or more temperature sensors within the housing 14 of the DUT assembly 12 and/or near the individual hardware units being tested, such that certain test patterns for memory testing are run at various hardware of the DUT assembly 12 when the control computer 50 has determined that the internal temperature of the DUT assembly 12 is at the desired test temperature.

Figure 6B:
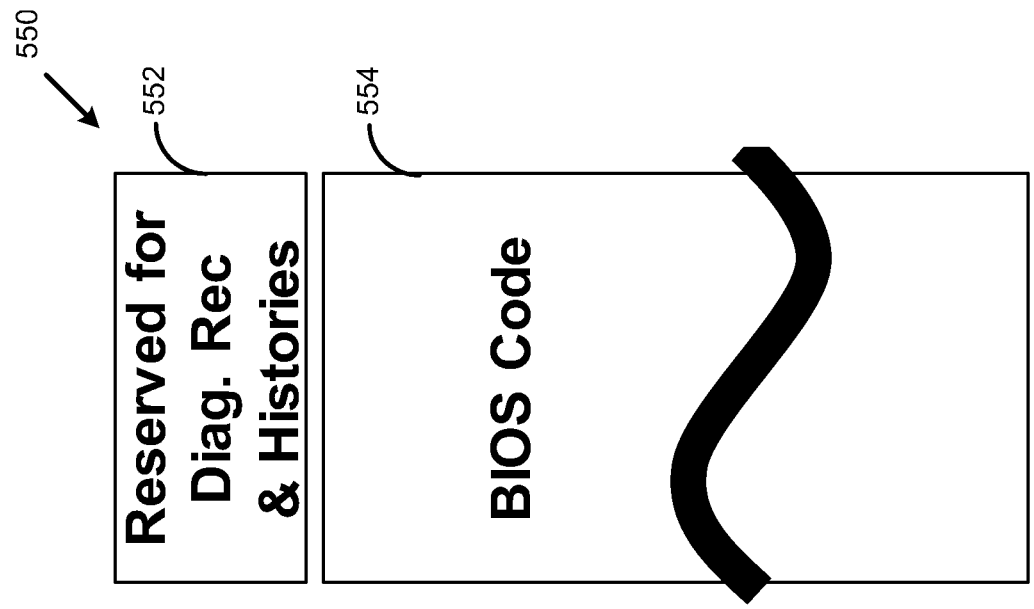
FIG. 6B is a diagram illustrating portions of memory that are used for implementing a Basic Input/Output System (BIOS) and recording the memory performance and analysis in accordance with the teachings herein.
Figure 6A:
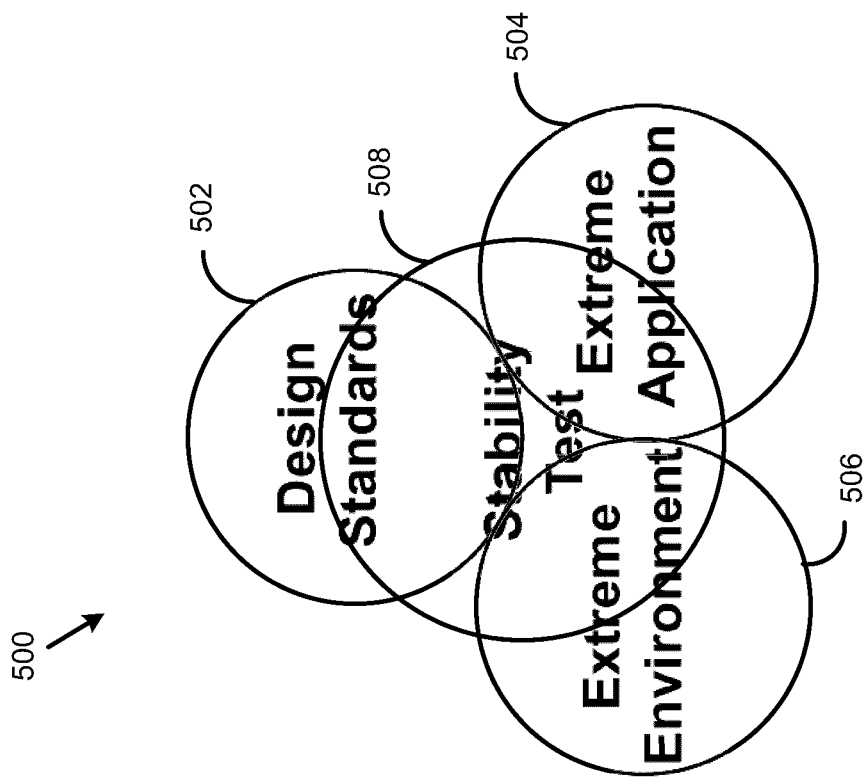
FIG. 6A is a diagram providing a schematic illustration of the test conditions used when verifying and analyzing memory performance in accordance with the teachings herein.

The test patterns that are used for memory testing in accordance with the teachings herein can be test patterns that are known to those skilled in the art depending on the type of memory being tested and the type of performance being tested for. However, the test patterns and test temperatures can be selected to satisfy a number of conditions in order to perform stability testing, an example of which is shown in FIG. 6A. Accordingly, a combination of certain design standards 502, extreme applications 504 (such as high and low amounts of memory usage) and extreme environments 506 (such as very high temperatures or very low temperatures) can be taken into account when determining the test temperatures and the test patterns to perform a given stability test indicated by an overlap 508 of the three criteria 502, 504 and 506.

The test results collected by the iMS diagnostic tool (or the test control module 80 depending on the implementation) is provided to the test control module 60 which performs analysis on the test results. The analysis can include determining margin settings at the different test temperatures for the memory components of the one or more tested DUTs so that when these memory components are operated during use in the field, the margin setting can be used corresponding to the current temperature of the one or more DUTs. Alternatively, at test temperatures where the operation of the one or more tested DUTs is completely unreliable, warning messages can be generated as the temperature approaches the test temperature where failure of the DUTs will occur (e.g. a failed temperature). The warning messages can indicate that operation of the DUTs will fail as the temperature approaches the failed temperature). In each of these embodiments the margin settings, warning messages and corresponding temperatures can be written to the Non-Volatile Random Access Memory (NVRAM) of the hardware, such as the server 70, that is using the DUT for margin setting. In at least one embodiment this data also be recorded by the control computer 50 for further analysis and/or to drive another level of interactive testing.

When the iMS diagnostic tool is configured with enhanced features, such as factory burn-in, weak memory cell tracking and/or weak I/O tracking, an additional Up-Down Stream Data Structure may be used. The Up-Stream Data Structure is defined using NVRAM parameters, which can be used to store critical historical data and re-boot control instructions. The iMS diagnostic tool can reserve a certain amount of memory such as up to 500 KB of memory 550 in the NVRAM on the motherboard (and/or Serial Presence Detect (SPD) on a memory module) as a "permanent" storage space for system records and normally won't use more than 200 KB as shown in FIG. 6B. The critical historical data and re-boot control instructions are stored separately from the BIOS code 554 and may be used for performing tracking and tracking for administration purposes.

In at least one embodiment, the iMS diagnostic tool or another tool of the hardware that uses the tested DUTs, such as the server 70, can also be used to store:
 a. Re-Boot Control Flags and a "To-Do" List;
 b. DRAM configurations and Parameters;
 c. Test Pattern Sequences;
 d. a Defective and Weak Memory Address List, including Weak I/O conditions; and
 e. a Surveillance List and Conditions.

During the factory setup and burn-in, the iMS diagnostic can work extensively with the MRC to obtain the memory test results at various temperatures and these memory test results may then be analyzed by the control computer 50, for example, to determine the temperature effect on the DUT, which can include recording the margins at various temperature conditions including extreme cold temperatures and extreme hot temperatures of the memory that was tested. From there, a reliable DUT can be produced with known margins at different operating temperatures so that the hardware of the DUT can operate in a more stable manner at these different temperatures by measuring the internal temperature periodically and then selecting the margin that was determined for the internal temperature such that the memory has a suitable performance.

Figure 2:
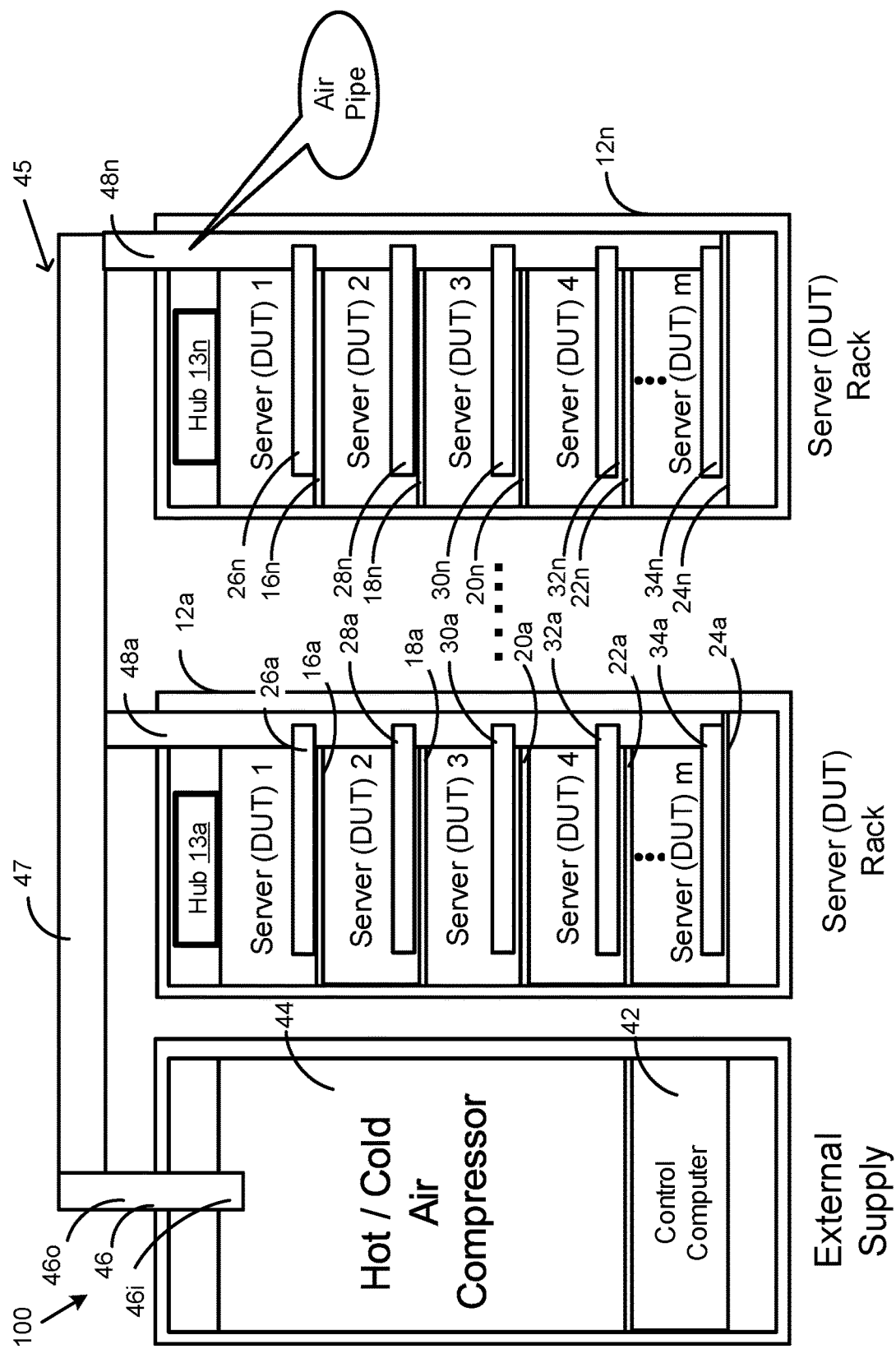
FIG. 2 is a schematic of another example embodiment of a test setup that may be used to test multiple DUTs to verify and analyze memory performance at different operating temperatures and to optionally perform repairs and categorize the DUTs in accordance with the teachings herein.

Referring now to FIG. 2, shown therein is a schematic of another example embodiment of a test setup 100 that may be used to test multiple DUTs (e.g. server DUTs) that are located in separate housings to verify and analyze memory performance at different operating temperatures and to optionally perform repairs and to optionally categorize the DUTs in accordance with the teachings herein. The test unit in the example embodiment of FIG. 2 is similar to that of FIG. 1 in that there is an external test unit that includes the control computer 42 and the air compressor 44 and there is a conduit 46 that provides the generated air to the server DUTs for memory testing at a certain temperature in accordance with the teachings herein. However, in this example embodiment, multiple server DUTs 12a to 12n within separate housings 14a to 14n receive the generated air such that the internal hardware components, e.g. server DUTs 26a to 34a of DUT assembly 12a to server DUTs 26n to 34n of DUT assembly 12n, are tested in parallel. There may be up to n DUT assemblies each having m sub-DUTs (e.g. server DUTs) that can be tested for memory performance at different internal test temperatures where m and n are integers and are not necessarily equal to one another. The conduit 46 has another pathway 47 that is used to couple with the air conduits 48a to 48n associated with DUT assemblies 12a to 12n, respectively. Accordingly, in such embodiments, the conduit 46 is coupled to the conduit 47 which comprises at least one branch point to connect the test unit with the air conduits associated with the housings of at least two DUT assemblies for testing the hardware of the at least two DUT assemblies in parallel.

Figure 3:
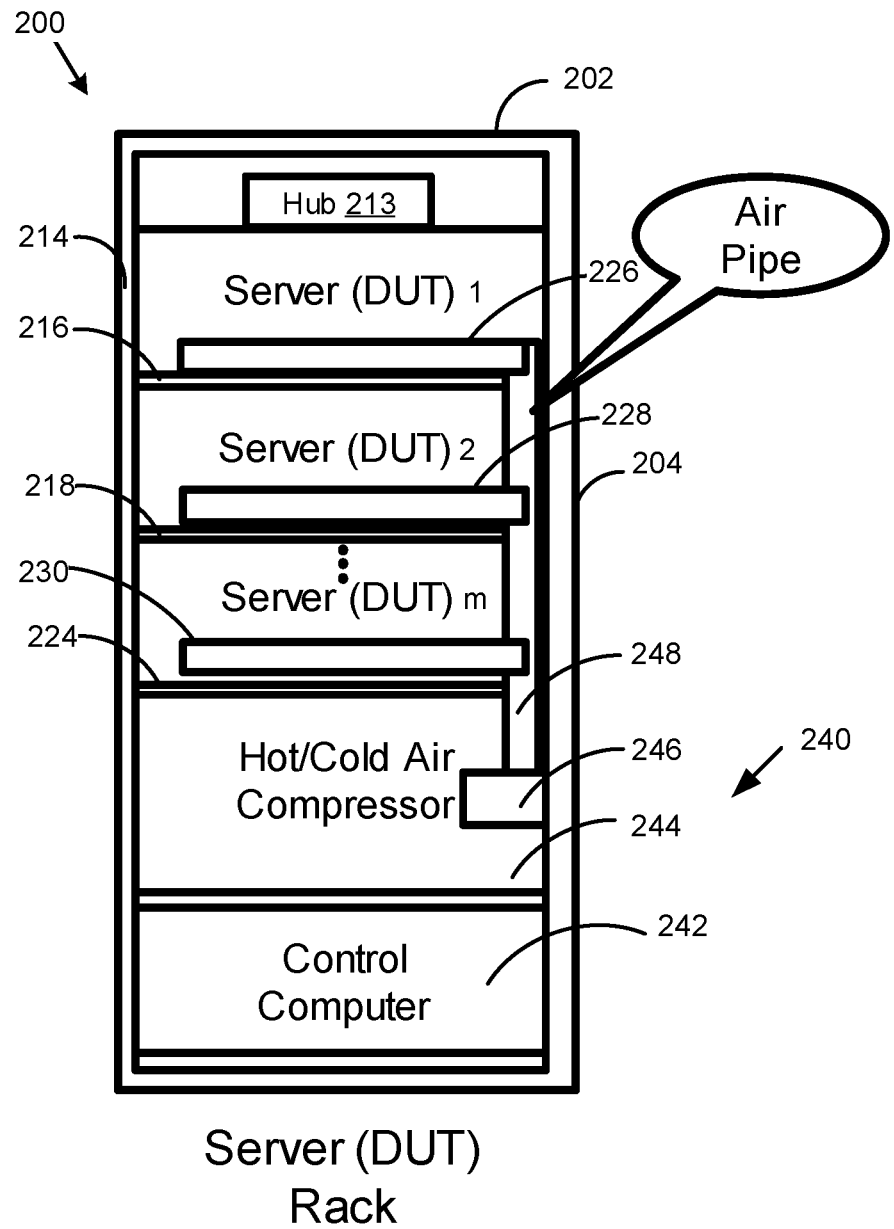
FIG. 3 is a schematic of another example embodiment of a test setup that may be used to test multiple DUTs to verify and analyze memory performance at different operating temperatures and to optionally perform repairs and categorize the DUTs in accordance with the teachings herein.

Referring now to FIG. 3, shown therein is a schematic of another example embodiment of a test setup 200 that may be used to test DUTs (e.g. server DUTs) to verify and analyze memory performance at different operating temperatures and to optionally perform repairs and categorize the DUTs in accordance with the teachings herein. In this example embodiment, the DUT assembly 202 comprises a DUT housing 204 and the air compressor 244 and the control computer 222 of the test unit are located in the DUT housing 204. In this example embodiment, the DUT assembly 202 is a server rack with separate server DUTs 226, 228 and 230 mounted on racks 216 to 224 respectively. The air compressor 244 includes a conduit 246 that is coupled to the air conduit 248 that is associated with the DUT assembly 202 to provide the generated hot air or cold air to each hardware component which is tested at a desired test temperature within the enclosure (i.e. housing) 204 of the DUT assembly 202.

Figure 4:
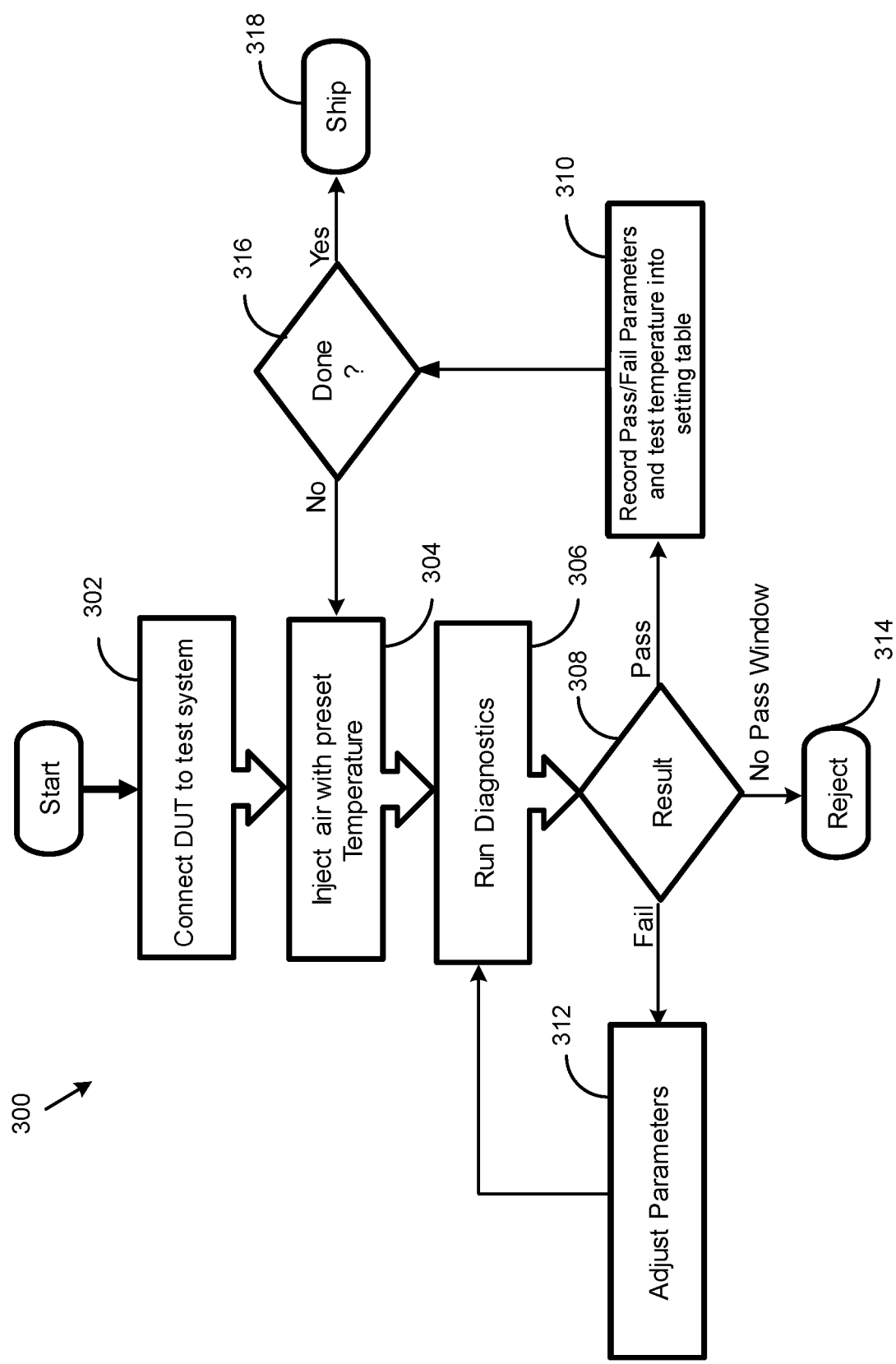
FIG. 4 is a flow chart of an example embodiment of a method for verifying and analyzing memory performance of a DUT at different operating temperatures in accordance with the teachings herein.

Referring now to FIG. 4, shown therein is a flow chart of an example embodiment of a method 300 for verifying and analyzing memory performance at different operating temperatures in accordance with the teachings herein. The method 300 generally performs the memory testing on a DUT, or multiple DUTs, in their normal working environment. The method 300 generally comprises: coupling an air compressor to an internal space within a housing of the DUT; generating a temperature control signal that is provided to the air compressor to generate an amount of hot or cold air to set an internal temperature of the DUT to a desired test temperature in the test temperature range; generating at least one test signal to test at least one memory component of the DUT at the desired test temperature; testing at least one memory component of the DUT 12 at the desired test temperature using the at least one test signal; obtaining test results from the testing of the DUT 12 that was performed at the desired test temperature; determining a parameter adjustment of the at least one memory component based on the test results so that the at least one memory component operates in a stable manner at the desired test temperature during normal use; storing the parameter adjustment along with the desired test temperature in a file or data record such as in a database, for example; and repeating the testing for other test temperatures in the temperature test range.

The testing method 300 is in contrast to current industry testing for a DUT in which burn-in testing is only done at a high temperature in order to just obtain a pass or fail result. Also, conventional testing is done by placing the DUT into a hot chamber rather than testing the DUT in its natural working environment. Furthermore, if the DUT is operating at the margin at the tested high temperature, the conventional memory testing method will not know this as it simply records a pass or fail result. The conventional burn-in testing will then result in many marginal failed memory units when the operating temperature of the memory unit is appreciably different than what was used during burn-in testing because the inventors have determined that the margins can change with temperature. The inventors have also determined that this is also true in cold operating environments since a low temperature may also cause margin drift, but computers are not generally tested in cold temperatures.

Therefore, with the testing methods described in accordance with the teachings herein, the exact margins are known for different operational temperatures from testing at various temperatures within a physical enclosure, i.e. the housing of the DUT assembly, that is actually used in practice (e.g. used in the field). Therefore, the settings for operating the memory, such as the timing windows, for example, can be adjusted depending on the operating temperature of the memory so that the memory unit does not operate too close to the margin and end up failing during use.

Figure 7A:
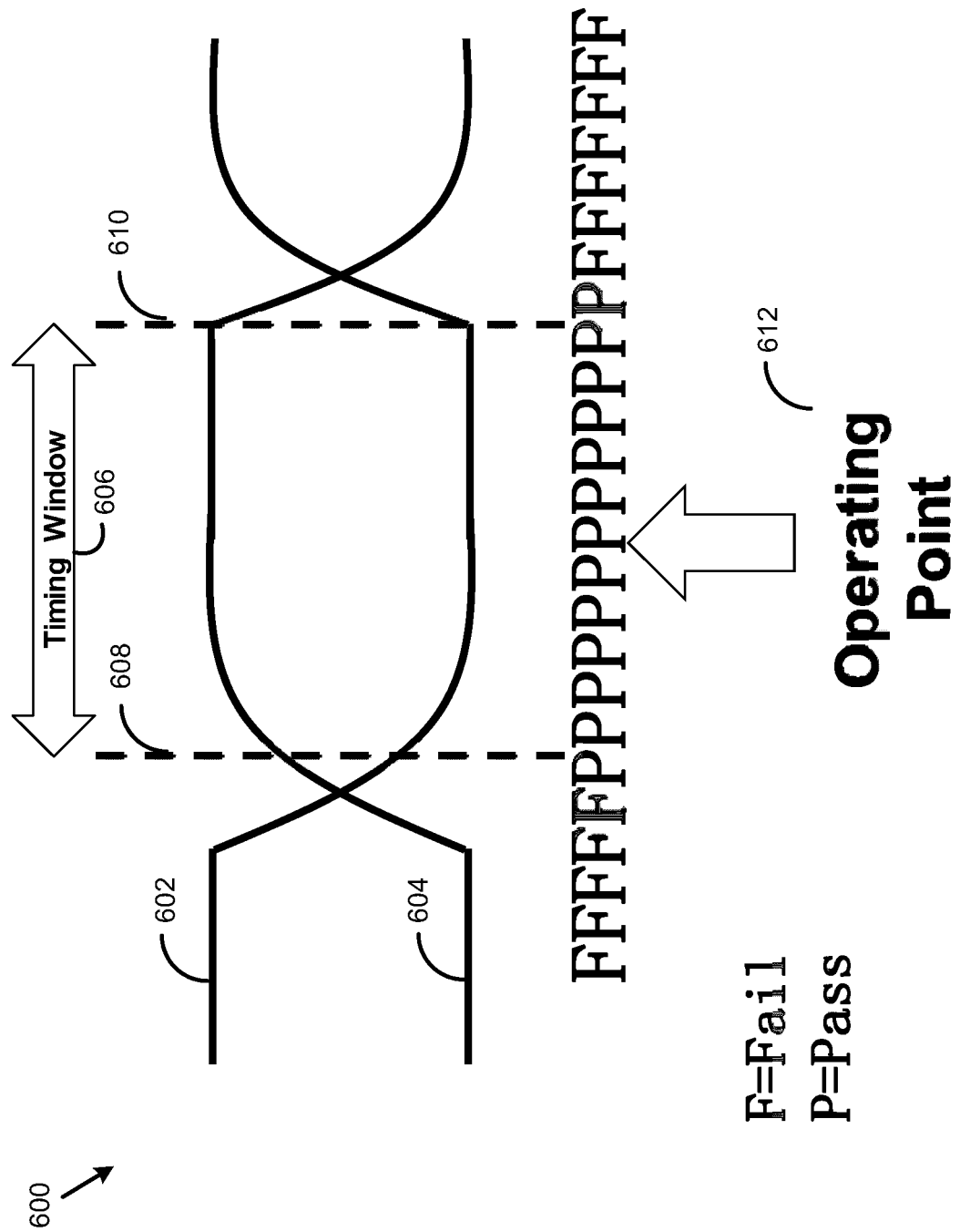
FIG. 7A is an illustration of a timing window that is defined for accessing memory in an ideal situation.
Figure 7B:
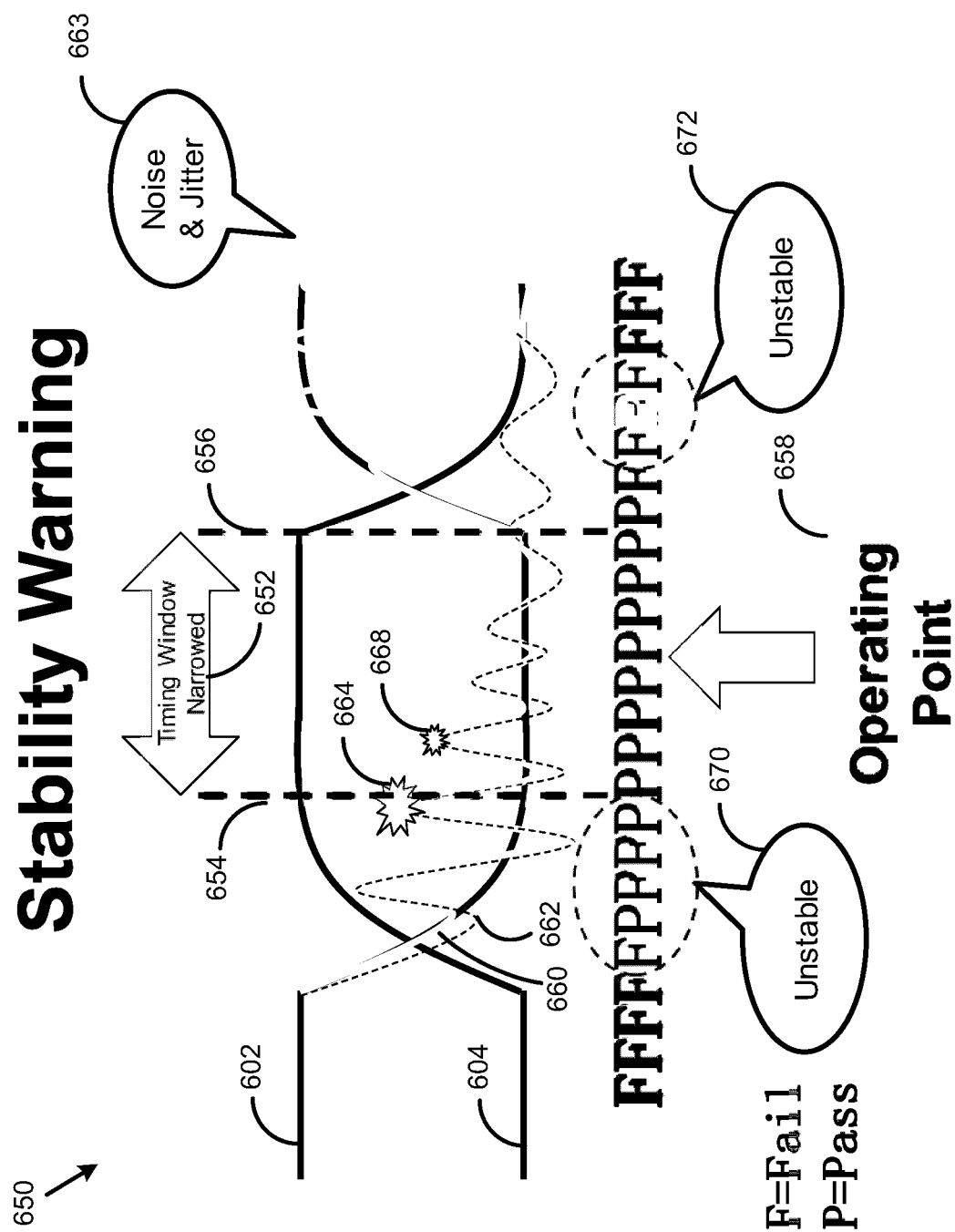
FIG. 7B is an illustration of a modified timing window that is defined for accessing memory under different operating conditions in accordance with the teachings herein.

For example, referring now to FIG. 7A, shown therein is an illustration of a timing window 600 with a start time 608 and an end time 610 that are defined based on timing curves 602 and 604 for accessing memory in an ideal situation in which case the operating point 612 is stable. This in contrast to FIG. 7B, which shows a modified timing window 652 that is defined with a start time 654 and an end time 656 that is narrower for accessing memory at a stable operating point 658 under a different temperature condition. This timing window 652 had to be adjusted since there is more jitter 663 with jitter components 660, 662, 664 and 668 (due to a different operating temperature) which lead to noise and instability if the timing window is too close to the conventional margins 670 and 672 where there is instability at this particular operating temperature. However, in accordance with the teachings herein, since the timing window adjustments for different operating temperatures is determined during testing of the DUT, the temperature test result data can be used to set the narrower timing window 652.

Referring back to FIG. 4, at act 302 of the testing method 300 a given DUT that is to be tested is connected to the test system so that the given DUT can receive air from the air compressor when the control computer performs memory testing on the given DUT at one or more desired temperatures in accordance with the teachings herein. For simplicity of illustration, the method 300 is described with respect to one DUT. However, it should be understood that the method 300 can be applied to several DUTs in parallel, where the DUTs can be in the same housing or different housings (as long as the test temperatures in those housings are properly recorded as they may not be the same).

At 304, the method 300 includes generating air and injecting the generated air to the DUT to achieve a desired test temperature at the DUT. This may be based on generating a temperature control signal by the test control module 60, for example, that is provided to the air compressor to generate an amount of hot or cold air to set an internal temperature of the DUT to the desired test temperature.

At 306, the method 300 includes running the diagnostics at the DUT for performing memory testing at the desired test temperature. The diagnostics involve generating at least one test signal to test at least one memory component of the DUT at the desired test temperature; testing the at least one memory component of the DUT at the desired test temperature using the at least one test signal and obtaining test results from the testing of the DUT that was performed at the desired test temperature. The testing is generally initiated by the test control module 60 and the testing may be done by the test control module 80 or it may involve uploading a revised BIOS (e.g. reflashed BIOS) to the hardware that uses the DUT. The test results are then recorded by the test control module 80 and sent to the test control module 60 for further analysis and next steps where the next steps, depending on the particular embodiment, include one or more of (1) calculating/determining locations of memory components of the DUT that failed a memory test, (2) possibly taking remedial actions such as sending repair or isolation commands to a component of the DUT assembly that failed the memory test, such as the server or the iMS diagnostic tool, for repairing or isolating the failed memory components, (3) determining margin requirements for the DUT at different test temperatures and/or (4) categorizing the performance or quality of the DUT.

Continuing with the example embodiment of method 300, at 308, the method 300 involves determining whether the DUT has passed the memory test. If the test is passed, the method 300 proceeds to act 310 where the pass/fail parameters and the desired test temperature are recorded into a database or a file such as a settings table. The method 300 then proceeds to act 316 where it is determined whether the testing is finished. If there are other desired temperatures to test at, then the method 300 goes to act 304 where the air compressor is used to inject air to achieve the next desired test temperature within the DUT and the method 300 proceeds as described previously. Alternatively, if it is determined at act 316 that the DUT has been tested at all desired test temperatures in the test temperature range and passed then the DUT is labelled as being suitable for shipping for use in the field.

Alternatively, if the test result is determined to be a fail at act 308, then the method 300 moves to act 312 where the method 300 involves a parameter adjustment or identification of the memory component based on the test results so that the memory component operates in a stable manner at the desired test temperature during normal use or is isolated from use in the field when the temperature of the DUT approaches the desired test temperature where failure occurred. For example, the parameter adjustment may involve adjusting certain memory parameters (e.g. the start and stop of the timing window). The method 300 then proceeds to act 306 where the same test diagnostic is rerun assuming that the internal temperature of the DUT is still at the desired test temperature to double-check that the parameter adjustment allows for the memory to pass the diagnostic test. If the test result is a pass then the method 300 proceeds to act 310 where the parameter adjustment(s) are stored along with the desired test temperature in a data file or a database. If the test result is a fail then the method 300 involves performing a further adjustment of the memory parameter to achieve a pass test result at the desired temperature. The method 300 then proceeds as described previously.

Alternatively, if at act 308 it is determined that all parameter adjustments (e.g. all viable start and stop times for the timing windows) have been tried and the DUT still fails the memory performance test for the desired test temperature, then the DUT is labelled as being rejected at act 314 and is not shipped for use in the field.

Figure 5B:
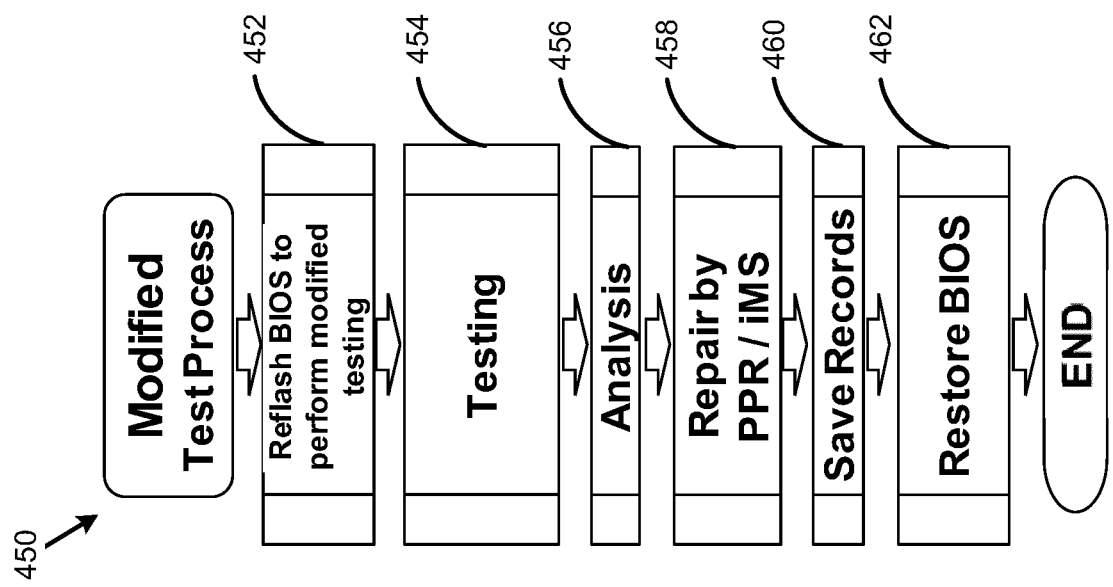
FIG. 5B is a flowchart of an example embodiment of a method of verifying and analyzing memory performance of a DUT at different operating temperatures and repairing memory in accordance with the teachings herein.
Figure 5A:
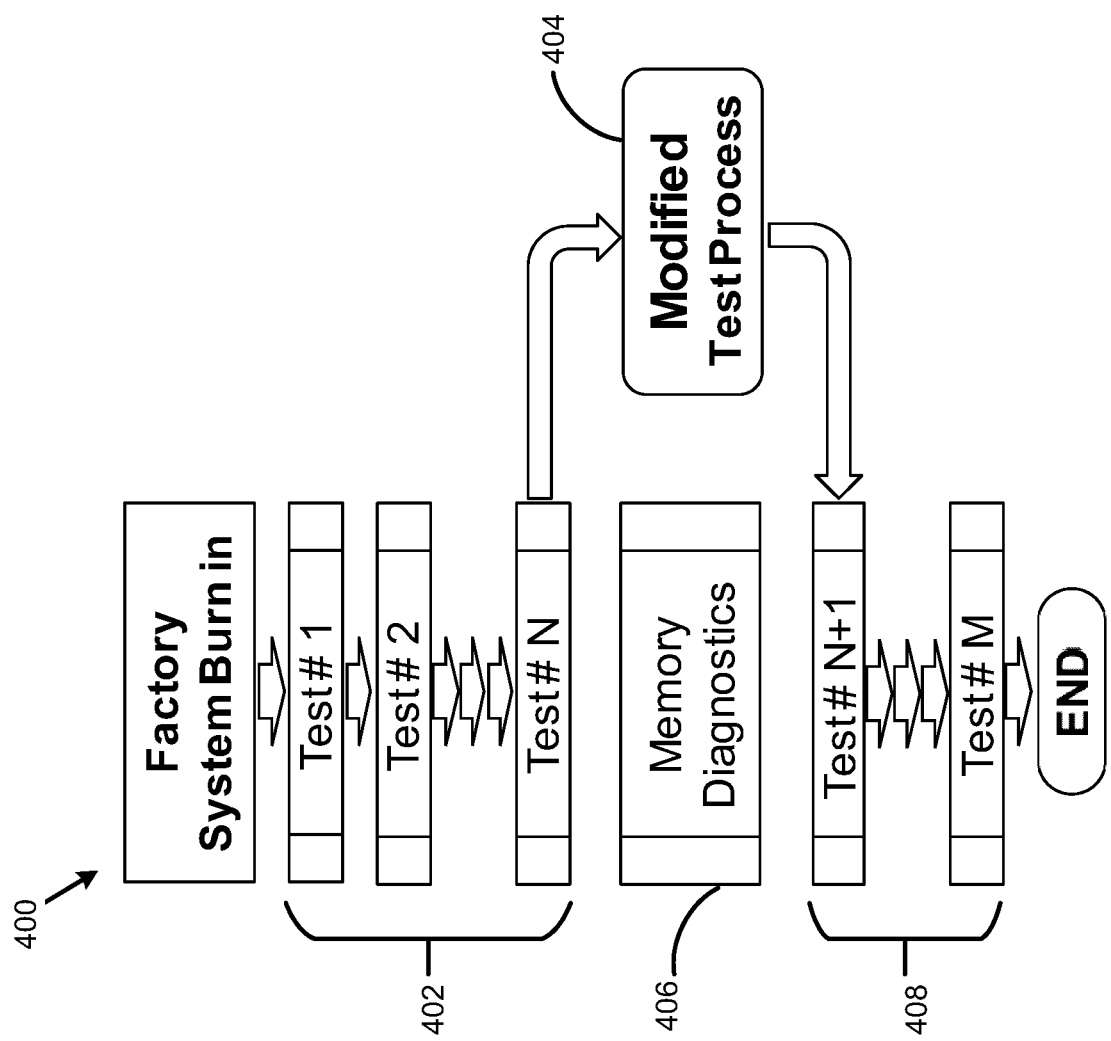
FIG. 5A is a flow chart of an example embodiment of a method for burn-in testing which employs a modified test method based on the method of verifying and analyzing memory performance of a DUT at different operating temperatures and repairing memory in accordance with the teachings herein.

Referring now to FIG. 5A, shown therein is a flow chart of an example embodiment of a method 400 for burn-in testing which employs a modified testing method based on the method of verifying and analyzing memory performance at different operating temperatures and repairing memory in accordance with the teachings herein.

At act 402, various tests #1 to #N are performed as is usually done in factory system burn in testing. At act 404, a modified test process for memory testing is performed in according with the teachings herein rather than using the conventional memory diagnostics at act 406. The modified test process 404 may be implemented by using the method 450 of FIG. 5B or method 300 of FIG. 4. After the modified test is completed, the method 400 proceeds to act 408 where further tests #N+1 to #M are performed as is conventionally done in the regular production flow.

Referring now to FIG. 5B, shown therein is a flowchart of an example embodiment of a method 450 of verifying and analyzing memory performance at different operating temperatures and repairing memory in accordance with the teachings herein. At act 452 the BIOS of the DUT is reflashed (e.g. by the test control module 60 or another element of the control computer 50) so that testing can be performed in accordance with the teachings herein (e.g. such as method 300) at act 454. The testing at act 454 may be done to achieve the objectives and stability testing indicated in FIG. 6A. In at least one embodiment, the testing at act 454 may be done to determine DRAM related parameters for stable operation at different temperatures. After the testing at act 454 is done, the method 450 proceeds to act 456 where the test results are analyzed to determine if any memory cells that have failed the tests can be repaired by using various methods such as, but not limited to, Post Package Repair (PPR) for hard failures or using certain functions of the iMS diagnostic tool to shield soft failures or weak cells, for example. After any repairs or shielding are made, the method 450 moves to act 460 where the test results are saved in various records of the DUT, the hardware element that uses the DUT (e.g. the server 70) and/or the control computer 50. At act 462, after testing has been done in accordance with the teachings herein, the BIOS of the DUT is restored to its normal functioning state at act 462.

While the applicant's teachings described herein are in conjunction with various embodiments for illustrative purposes, it is not intended that the applicant's teachings be limited to such embodiments. On the contrary, the applicant's teachings described and illustrated herein encompass various alternatives, modifications, and equivalents, without departing from the embodiments described herein, the general scope of which is defined in the appended claims.

The invention claimed is:

1. A system for performing memory testing on a Device Under Test (DUT) in a working environment in which it will operate when deployed, wherein the system comprises:
an air compressor that is adapted to generate hot or cold air;
a first conduit that is coupled between the air compressor and an air conduit associated with the DUT to provide the generated hot or cold air to the air conduit to adjust an internal temperature the working environment of the DUT to a desired test temperature; and
a control computer that is coupled to the air compressor and the DUT, the control computer comprising a control processing unit having hardware that is configured to:
generate a temperature control signal that is provided to the air compressor to generate an amount of the hot air or cold air to set the internal temperature of the DUT to the desired test temperature;
generate at least one test signal to test that is used for testing at least one memory component of the DUT;
send the at least one test signal to a test hardware element that is configured for performing testing on the at least one memory component of the DUT at the desired test temperature;
obtain test results for testing the at least one memory component of the DUT at the desired test temperature;
determine a parameter adjustment of the at least one memory element based on the test results so that the at least one memory element operates in a stable manner at the desired test temperature; and
store the parameter adjustment along with the desired test.

2. The system of claim 1, wherein the test hardware element comprises a server.

3. The system of claim 2, wherein the server comprises a test control module that is configured to receive the at least one test signal from the test control module, perform the testing on the DUT, record test results and send the test results to the test control module.

4. The system of claim 2, wherein the server comprises a BIOS program and the control computer is configured to update to the BIOS program to perform the memory testing.

5. The system of claim 2, wherein the control computer is configured to determine given memory components that fail the memory tests and send a command to the server to repair the given memory components or the control computer is configured to determine given memory components that fail the memory tests and when the given memory components cannot be repaired the control computer is configured to send a command to the server to isolate the given memory components.

6. The system of claim 1, wherein the control computer is configured to categorize the DUT based on performance of the memory testing of the DUT.

7. The system of claim 1, wherein the parameter adjustment comprises determining margins for a timing window for reading and/or writing to memory of the DUT in a stable manner and the desired test temperature.

8. The system of claim 1, wherein the control computer is further configured to generate the temperature control signal, generate the at least one test signal, determine the parameter adjustment and store the parameter adjustment for a plurality of test temperatures for testing the at least one memory component of the DUT from a lowest temperature to a highest temperature.

9. The system of claim 1, wherein the air compressor and the control computer are located in a test unit housing that is physically separate from the DUT.

10. The system of claim 9, wherein the first conduit is coupled to at least one branch point to connect the physical test unit with air conduits associated with at least two DUTs for testing the at least two DUTs in parallel at the desired test temperature.

11. The system of claim 1, wherein the DUT is a memory module of a server or there are multiple DUTs in a rack mounted server with a plurality of server components each having an associated DUT mounted on separate racks within the rack mounted server and the air conduit has a plurality of outputs for providing the generated air to the DUTs of each of the server components.

12. The system of claim 1, wherein the air conduit associated with the DUT is an internal air conduit that is located within a housing that includes the DUT or the air conduit associated with the DUT is an external air conduit that is mounted to an external surface of the housing that includes the DUT with outlets adjacent to air vents of the DUT to provide the generated air into the DUT.

13. The system of claim 1, wherein the DUT comprises a DUT housing and the air compressor and the control computer are located in a housing that includes the DUT and the air conduit associated with the DUT is an internal air conduit that is located within the housing that includes the DUT.

14. A method for performing memory testing on a Device Under Test (DUT) in its working environment in which it will operate when deployed, wherein the method comprises:
coupling an air compressor to an internal space with a housing of the DUT;
generating a temperature control signal that is provided to the air compressor to generate an amount of hot air or cold air to set an internal temperature of the working environment of the DUT to a desired test temperature;
generating, using a control computer, at least one test signal to test at least one memory component of the DUT at the desired test temperature;
sending the at least one test signal to a test hardware element that is configured for performing testing on the at least one memory component of the DUT at the desired test temperature;
performing, using the test hardware element, testing on the at least one memory component of the DUT at the desired test temperature using the at least one test signal;
obtaining, at the control computer, test results for testing the at least one memory component of the DUT at the desired test temperature;
determining, at the control computer, a parameter adjustment of the at least one memory element based on the test results so that the at least one memory element operates in a stable manner at the desired test temperature; and
storing the parameter adjustment along with the desired test temperature.

15. The method of claim 14, wherein the parameter adjustment comprises determining margins for a timing window for reading and/or writing to memory of the DUT in a stable manner and the desired test temperature.

16. The method of claim 14, wherein the method comprises, using the control computer, generating the temperature control signal, generating the at least one test signal, determining the parameter adjustment and storing the parameter adjustment for a plurality of test temperatures for testing the DUT from a lowest temperature to a highest temperature.

17. The method of claim 14, wherein the method comprises categorizing the DUT, using the control computer, based on performance of the memory testing of the DUT.

18. The method of claim 14, wherein the test hardware element comprises a test control module and the method comprises receiving the at least one test signal at the test control module, performing the testing on the DUT using the test control module, record test results using the test control module and sending the test results to the control computer.

19. The method of claim 18, wherein the test hardware element is a server that comprises a BIOS program and the method comprises sending data from the control computer to the server to update the BIOS program to perform the memory testing.

20. The method of claim 18, wherein the method comprises determining, using the control computer, given memory components that fail the memory tests and sending a command to the server to repair the given memory components or the method comprises determining, using the control computer, given memory components that fail the memory tests and when the given memory components cannot be repaired a command is sent from the control computer to the server to isolate the given memory components.

* * * * *